(12) United States Patent
Tanaka et al.

(10) Patent No.: US 7,638,854 B2
(45) Date of Patent: Dec. 29, 2009

(54) SEMICONDUCTOR DEVICE, DISPLAY MODULE, AND MANUFACTURING METHOD OF SEMICONDUCTOR DEVICE

(75) Inventors: Yasuhiko Tanaka, Fukuyama (JP); Kenji Toyosawa, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 466 days.

(21) Appl. No.: 11/332,310

(22) Filed: Jan. 17, 2006

(65) Prior Publication Data
US 2006/0157827 A1    Jul. 20, 2006

(30) Foreign Application Priority Data
Jan. 18, 2005    (JP) .............................. 2005-010847

(51) Int. Cl.
*H01L 23/34*    (2006.01)
*H01L 23/04*    (2006.01)
*H01L 23/48*    (2006.01)
*H01L 23/52*    (2006.01)
*H01L 23/40*    (2006.01)

(52) U.S. Cl. ........................ 257/508; 257/724; 257/725; 257/730; 257/737; 257/E23.007; 438/119; 438/126

(58) Field of Classification Search ........................ None
See application file for complete search history.

(56) References Cited

U.S. PATENT DOCUMENTS

| | | | | |
|---|---|---|---|---|
| 4,338,377 A | * | 7/1982 | Beck et al. | 428/428 |
| 4,678,688 A | * | 7/1987 | Itoh et al. | 427/387 |
| 5,098,814 A | * | 3/1992 | Tunney et al. | 430/275.1 |
| 5,122,436 A | * | 6/1992 | Tunney et al. | 430/288.1 |
| 5,324,566 A | * | 6/1994 | Ogawa et al. | 428/141 |
| 5,869,219 A | * | 2/1999 | Kuo et al. | 430/270.1 |
| 6,153,304 A | * | 11/2000 | Smith et al. | 428/447 |
| 6,545,121 B1 | * | 4/2003 | Matsubara et al. | 528/483 |
| 7,312,285 B2 | * | 12/2007 | Chun et al. | 526/171 |
| 7,442,752 B2 | * | 10/2008 | Chun et al. | 526/281 |
| 2002/0123592 A1 | * | 9/2002 | Zhang et al. | 528/10 |

(Continued)

FOREIGN PATENT DOCUMENTS

JP    06-157875    6/1994

(Continued)

OTHER PUBLICATIONS

Inagaki et al. Improved Adhesion Between Kapton Film and Copper Metal by Silane-Coupling Reactions. Jun. 14, 1999. Journal of Applied Polymer Science, vol. 73, pp. 1645-1654.*

(Continued)

*Primary Examiner*—Andy Huynh
*Assistant Examiner*—Hoang-Quan T Ho
(74) *Attorney, Agent, or Firm*—Harness, Dickey & Pierce, P.L.C.

(57) ABSTRACT

A semiconductor device is provided that includes wiring patterns on a substrate formed of an organic insulating film, and a semiconductor chip mounted on the substrate. A liquid crystal display panel and a PW board are electrically connected to each other with an anisotropic conductive adhesive. At least one surface of the insulating film is treated with a silicon coupling material. The silicon coupling material contains silicon (Si) at a surface element density of 0.5 atomic percent to 12.0 atomic percent on a surface of the insulating film.

36 Claims, 5 Drawing Sheets

U.S. PATENT DOCUMENTS

2004/0265599 A1* 12/2004 Ushio et al. .................. 428/447
2006/0110606 A1* 5/2006 Luten .......................... 428/432

FOREIGN PATENT DOCUMENTS

| JP | 07-333623 | * | 12/1995 |
| JP | 11-029852 | * | 2/1999 |
| JP | 11-297762 | * | 10/1999 |
| JP | 2005-322682 | * | 11/2005 |
| JP | 2005322682 A | * | 11/2005 |
| TW | 588806 | | 5/2004 |
| WO | WO 03/011593 | | 2/2003 |
| WO | WO/2005039258 | | 4/2005 |
| WO | WO2006059845 | * | 6/2006 |

OTHER PUBLICATIONS

Taiwan Search Report for Corresponding Patent Application, and English translation thereof.

* cited by examiner

SPROCKET HOLE

SEMICONDUCTOR DEVICE, DISPLAY MODULE, AND MANUFACTURING METHOD OF SEMICONDUCTOR DEVICE

This Nonprovisional application claims priority under 35 U.S.C. § 119(a) on Patent Application No. 010847/2005 filed in Japan on Jan. 18, 2005, the entire contents of which are hereby incorporated by reference.

FIELD OF THE INVENTION

The present invention relates to a semiconductor device, called COF (Chip On FPC, Chip On Film), in which wiring patterns are formed on a substrate formed of an organic insulating film, and in which a semiconductor chip is connected to the wiring patterns. The invention also relates to a display module, and a manufacturing method of such a semiconductor device.

Examples of a display module include: a liquid crystal display module of, for example, an active-matrix type; an electrophoretic display, twist-ball display, a reflective display using a micro prism film, a digital mirror display, and similar types of displays employing a light modulation device; an organic EL light emitting element, inorganic EL light emitting element, a LED (Light Emitting Diode), and similar types of displays employing a light emitting element capable of varying luminance; a field emission display (FED); and a plasma display.

BACKGROUND OF THE INVENTION

Figure 8:
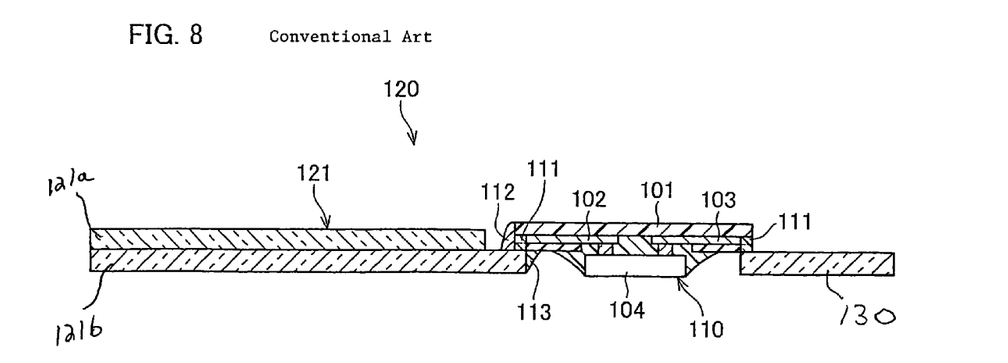
FIG. 8 is a cross sectional view illustrating a conventional liquid crystal module.

A conventional liquid crystal module 120 includes, as shown in FIG. 8, a liquid crystal display panel 121, and a COF (Chip on FPC, Chip on Film) semiconductor device 110 bonded and mounted on the liquid crystal display panel 121 with an anisotropic conductive adhesive (ACF: Anisotropic Conductive Film) 111. The COF semiconductor device 110 includes a semiconductor chip 104 connected to a substrate 101 formed of an organic insulating film and on which wiring patterns 102 and 103 are formed. The liquid crystal display panel 121 includes a TFT (Thin Film Transistor) substrate 121*a* and a color filter substrate 121*b*. On one side of the semiconductor device 110 opposite the liquid crystal display panel 121, a PW (Printed Wiring) board 130 is attached.

A problem of such a conventional semiconductor device and its display module and manufacturing method, however, is the poor adhesion strength between the insulating film substrate 101 and the anisotropic conductive adhesive 111. This may lead to detachment of the bonding part between the substrate 101 and the anisotropic conductive adhesive 111 when the liquid crystal module 120 is subjected to mechanical stress.

Therefore, in order to prevent electrical failure caused by detachment of the bonding part, it has been conventionally required to additionally apply a reinforcing material 112 and 113 around portions bonded with the liquid crystal display panel 121. This adds a large cost to the manufacturing cost of the liquid crystal module.

For the purpose of improving adhesion of the reinforcing material, Japanese Laid-Open Patent Publication No. 157875/1994 (Tokukaihei 6-157875, published on Jun. 7, 1994) proposes using a polyimide siloxane solution composition as a reinforcing material. The polyimide siloxane composition contains epoxy resin, rosin ester, and soluble polyimide siloxane, and is highly soluble in an organic solvent. As taught by the publication, the polyimide siloxane solution is easy to apply, dry, and cure.

However, even with such a semiconductor device and its display module and manufacturing method, the foregoing conventional problem remains because it still requires the additional reinforcing material 112 and 113.

SUMMARY OF THE INVENTION

An object of the present invention is to provide a semiconductor device, a display module, and a manufacturing method of a semiconductor device, which provide improved adhesion between an insulating film substrate and an anisotropic conductive adhesive, and which require no additional adhesion reinforcing member.

In order to achieve the foregoing object, the present invention provides a semiconductor device in which wiring patterns are formed on a substrate that is formed of an organic insulating film, and in which a semiconductor chip is mounted, wherein at least one surface of the insulating film is treated with a silicon coupling material, and the silicon coupling material contains silicon (Si) at a surface element density of 0.5 atomic percent to 12.0 atomic percent on the treated surface of the insulating film.

According to the invention, the surface of the organic insulating film is treated with the silicon coupling material. Thus, in making electrical contacts between the wiring patterns of the semiconductor device and the wirings of external circuit boards with the use of an anisotropic conductive adhesive, the adhesion between the insulating film substrate and the anisotropic conductive adhesive can be improved. There accordingly will be no electrical failure caused by detachment, and application of additional reinforcing materials will not be necessary. As a result, cost is reduced.

Further, in a semiconductor device of the present invention, the silicon coupling material contains silicon (Si) at a surface element density of 0.5 atomic percent to 12.0 atomic percent on the treated surface of the insulating film.

This effectively improves the adhesion between the insulating film substrate and the anisotropic conductive adhesive. There accordingly will be no electrical failure caused by detachment, and application of additional reinforcing materials will not be necessary. As a result, cost is reduced.

Thus, with the semiconductor device, the adhesion between the insulating film substrate and the anisotropic conductive adhesive can be improved, and no additional adhesion reinforcing member will be required.

A display module of the present invention uses the semiconductor device, wherein the semiconductor device is electrically connected to a display panel with the anisotropic conductive adhesive.

Thus, with the display module, the adhesion between the insulating film substrate and the anisotropic conductive adhesive can be improved, and no additional adhesion reinforcing member will be required.

A manufacturing method of a semiconductor device of the present invention includes the steps of: surface-treating an organic insulating film with a silicon coupling material so that the insulating film contains silicon (Si) at a surface element density of 0.5 atomic percent to 12.0 atomic percent on a surface of the insulating film; and forming wiring patterns on a substrate formed of the organic insulating film, and mounting a semiconductor chip on the substrate.

Thus, with the manufacturing method of a semiconductor device, the adhesion between the insulating film substrate and the anisotropic conductive adhesive can be improved, and no additional adhesion reinforcing member will be required.

Additional objects, features, and strengths of the present invention will be made clear by the description below. Further, the advantages of the present invention will be evident from the following explanation in reference to the drawings.

DESCRIPTION OF THE EMBODIMENTS

Referring to FIG. 1 through FIG. 7, the following will describe one embodiment of the present invention.

A liquid crystal module 20 provided as a display module of the present embodiment includes a liquid crystal display panel 21, and a semiconductor device 10 mounted thereon, as illustrated in FIG. 1(a). The liquid crystal display panel 21 includes a TFT (Thin Film Transistor) substrate 21a and a color filter substrate 21b. On one side of the semiconductor device 10 opposite the liquid crystal display panel 21, a PW (Printed Wiring) board 30 is attached. The liquid crystal display panel 21 and the PW board 30 serve as external circuit boards of the present invention.

The semiconductor device 10 is used to drive the liquid crystal display panel 21. As illustrated in FIGS. 2(a) and 2(b), the semiconductor device 10 has a structure known as COF (Chip on FPC, Chip on Film), in which a semiconductor chip 4 is connected to a substrate 1 formed of an organic insulating film and on which wiring patterns 2 and 3 are formed. That is, in COF, the semiconductor chip 4 is directly mounted on a flexible film.

The wiring patterns 2 and 3 are copper (Cu) leads plated with tin (Sn), for example. The semiconductor chip 4 has bump electrodes 5 made of gold (Au). The bump electrodes 5 are bonded with the wiring patterns 2 and 3 to conduct electricity.

Specifically, the bump electrodes 5 formed on the semiconductor chip 4 of the COF are bonded with the wiring patterns 2 and 3 of the insulating film according to the following procedure. First, the Sn-plated wiring patterns 2 and 3 are aligned face to face with the Au bump electrodes 5 formed on the semiconductor chip 4. Then, over a certain time period, pressure is applied with heat from the surface of the semiconductor chip 4 opposite the bump electrodes 5, or from the surface of the insulating film opposite the wiring patterns 2 and 3, so as to form a gold (Au)-tin (Sn) alloy.

Further, in the present embodiment, a resin underfill 6 is injected into a gap between the semiconductor chip 4 and the insulating film, and around the semiconductor chip 4, after bonding the bump electrodes 5 with the wiring patterns 2 and 3 of the insulating film, for example. In this way, moisture resistance and mechanical strength of the semiconductor device 10 can be improved.

Further, as required, an insulating solder resist 7 is formed on the insulating film, except for external connection terminals of the insulating film, the semiconductor chip 4, and areas around the semiconductor chip 4. This prevents shorting caused by conductive foreign particles adhering to the wiring patterns 2 and 3.

Note that, during manufacture, a plurality of semiconductor devices 10 are formed in series on a continuous insulating film shown in FIG. 2(a). For use, the semiconductor devices 10 each having the semiconductor chip 4 mounted on the insulating substrate 1 are cut out into individual pieces according to a user-defined shape 8 set for the insulating film.

In the liquid crystal module 20 of the present embodiment, as shown in FIG. 1(a), the semiconductor device 10 is bonded with the liquid crystal display panel 21 and the PW board 30 with an anisotropic conductive adhesive (ACF: Anisotropic Conductive Film) 11, so as to conduct electricity. The anisotropic conductive adhesive 11 is an adhesive film, 15 μm to 45 μm thick, in which conductive particles with a particle diameter of 3 μm to 15 μm are dispersed. Since the conductive particles are dispersed in the film, the anisotropic conductive film 11 itself is an insulator. However, with the anisotropic conductive adhesive 11 sandwiched between circuit patterns, the upper and lower substrates can be bonded together under applied heat and pressure, while ensuring conduction between upper and lower electrodes and insulation between adjacent electrodes.

In the present embodiment, the insulating film used for the substrate 1 is made of organic material, and, as shown in FIG. 1(b), the surface of the substrate 1 has been treated with a silicon coupling material 31.

More specifically, in the present embodiment, the insulating film used for the substrate 1 is made of an organic material, for example, such as polyimide. Polyimide is a plastic having the imide bonds in the backbone, making it one of the most heat resistance plastics available. The insulating film used for the substrate 1 is not just limited to this example, and other organic materials may be used as well.

Further, in the present embodiment, the silicon coupling material 31 has constituting elements, for example, with the SiX structure, such as SiOn, Si(OH)n, and SiOn(OH)n, where n is a variable.

Generally, physical absorption (Van der Waal bonding) and chemical absorption (hydrogen bonding) of water ($H_2O$) molecules occur on the surface of the organic insulating film. As such, the surface of the insulating film has molecular layers of water. This renders the surface of the insulating film hydrophilic. Thus, if the anisotropic conductive adhesive 11 of, for example, epoxy resin is brought into contact with the hydrophilic surface of the insulating film, bonding occurs between the hydroxy group (—OH) of the epoxy resin and the water molecules adhered to the insulating film surface, with the result that the adhesion of the epoxy resin is reduced. Therefore, in order to quickly remove the molecular layers of water from the surface of the insulating film and render the surface of the insulating film hydrophobic, the surface of the insulating film is treated with the silicon coupling material 31. By the surface treatment of the insulating film with the use of the silicon coupling material 31 for example, the hydroxy group (—OH) on the surface of the insulating film can react with the silicon coupling material 31, making the surface of the insulating film hydrophobic. As a result, the adhesion between the insulating film and the anisotropic conductive adhesive 11 of epoxy resin is improved.

In the present embodiment, it is preferable that the silicon contained as the constituting element of the silicon coupling material 31 be in a range of 0.5 atomic percent to 12.0 atomic percent (surface element density) on the surface of the insulating film. The surface of the insulating film can have a surface element density in this range when the silicon coupling material 31, containing a solvent, is dried. It is more preferable that the silicon (Si) contained as the constituting element of the silicon coupling material 31 be in a range of 1.0 atomic percent to 6.0 atomic percent (surface element density) on the surface of the insulating film.

With the silicon coupling material 31, the adhesion strength between the anisotropic conductive adhesive 11 and the insulating film substrate 1 can be improved over conventional examples, as will be described later in Examples. Thus, even if the semiconductor device 10 portion is bent away from the liquid crystal display panel 21 for example, the insulating film substrate 1 will not detach from the anisotropic conductive adhesive 11. If the amount of silicon coupling material 31 on the surface of the insulating film is at or below 0.4 atomic percent (surface element density), the effect of surface treatment was not obtained and there was no improvement in adhesion. The bonding strength decreased when the amount of silicon coupling material 31 was at or above 13 atomic percent (surface element density).

In the following, description is made as to manufacturing methods of the semiconductor device 10 and the liquid crystal module 20.

First, the surface of the insulating film is treated with the silicon coupling material 31. For example, in the surface treatment, the silicon coupling material 31 is sprayed onto the both sides of the insulating film, followed by drying. The insulating film may be dried by heating. It is not necessarily required that the silicon coupling material 31 be applied to both sides of the insulating film. Only one side of the insulating film may be coated with the silicon coupling material 31. With the silicon coupling material 31 adhered to the surface(s) of the insulating film, the insulating film is surface-treated. The coating method is not just limited to spray-coating, and other common coating methods such as brushing or roller coating may be used as well.

Next, as illustrated in FIGS. 2(a) and 2(b), the wiring patterns 2 and 3 are formed on the substrate 1 formed of the organic insulating film, and the wiring patterns 2 and 3 are connected to the semiconductor device 10. Here, a plurality of semiconductor devices 10 are fabricated on a continuous insulating film, before they are cut out into individual pieces according to the user-defined shape 8.

Thereafter, as shown in FIG. 1(a), the wiring pattern 2 of the semiconductor device 10 is electrically connected to the liquid crystal display panel 21 with the anisotropic conductive adhesive 11. The wiring pattern 3 of the semiconductor device 10 is connected to the PW board 30. The result is the liquid crystal module 20.

In the liquid crystal module 20 of the present embodiment, the adhesion strength between the anisotropic conductive adhesive 11 and the insulating film substrate 1 is improved by the surface treatment of the silicon coupling material 31.

Thus, the semiconductor device 10 will not easily detach from the insulating film even if the insulating film is bent by such a force that would cause detachment in a conventional device. There accordingly will be no electrical failure caused by detachment of the anisotropic conductive adhesive 11 from the substrate 1. It is therefore not required to additionally provide the conventionally required reinforcing materials.

Figure 1:
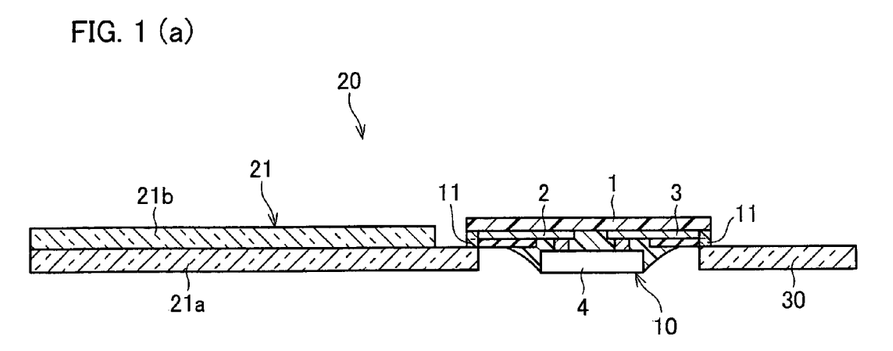
FIG. 1(a) is a cross sectional view illustrating one embodiment of a liquid crystal module of the present invention.
FIG. 1(b) is a cross sectional view illustrating an insulating film, surface-treated with a silicon coupling material, used for a substrate of a semiconductor device mounted in the liquid crystal module.
Figure 2:
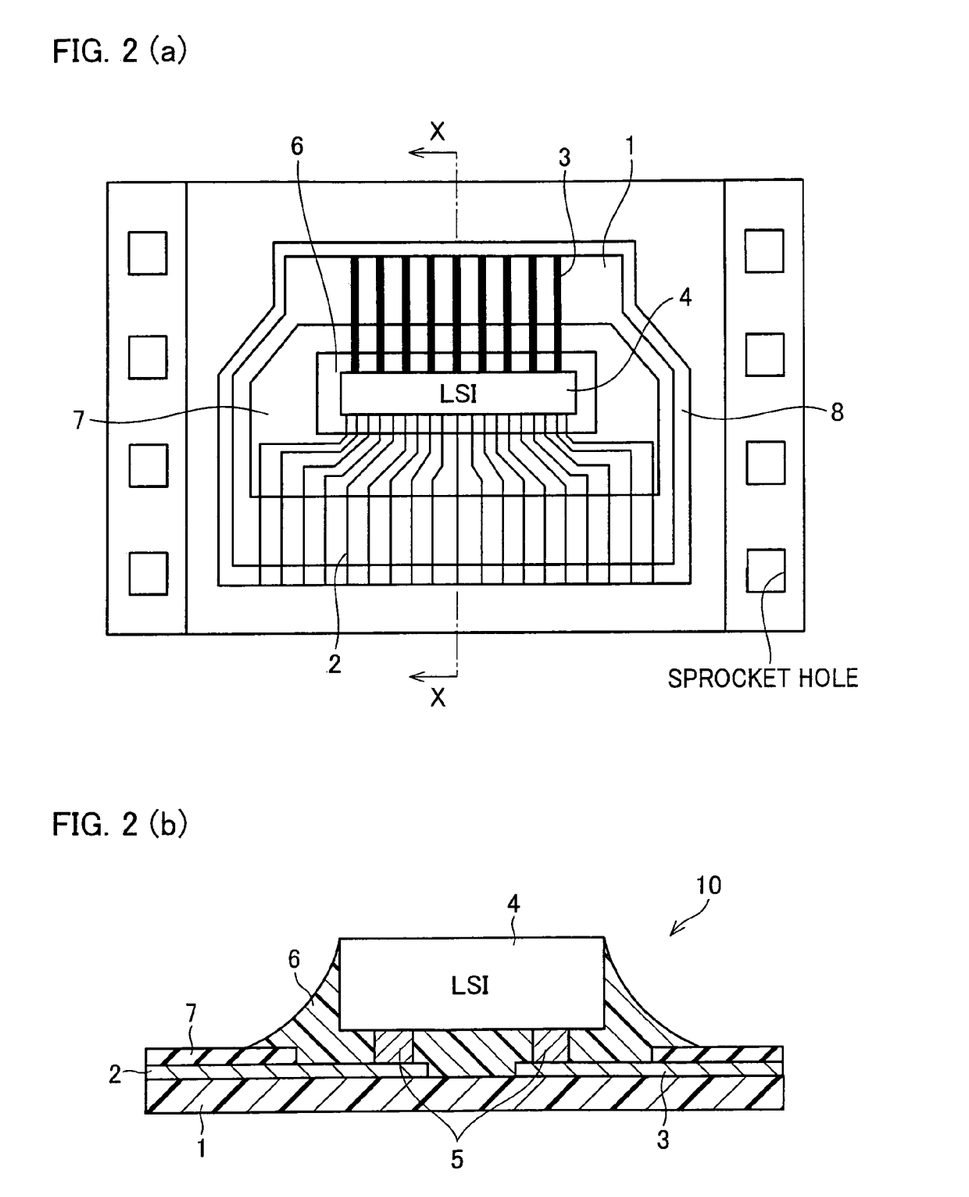
FIG. 2(a) is a plan view illustrating the COF semiconductor device.
FIG. 2(b) is a cross sectional view illustrating the COF semiconductor device.
Figure 3:
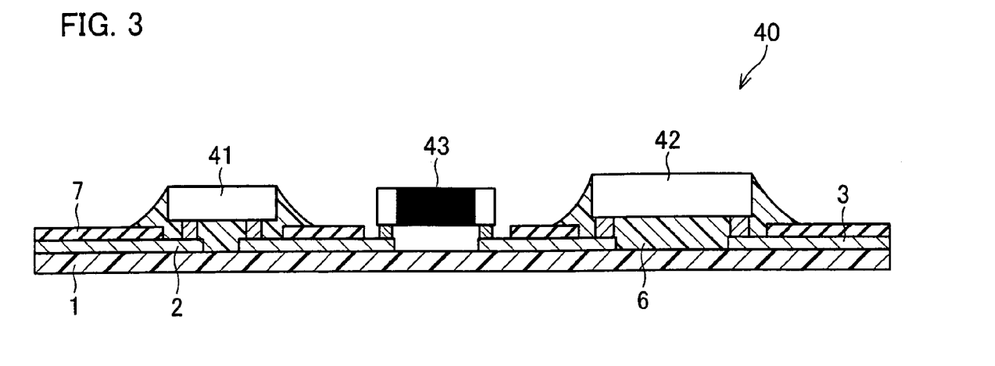
FIG. 3 is a cross sectional view illustrating a semiconductor device in which a plurality of semiconductor chips and electrical components are mounted on the substrate.

It should be noted here that the present invention is not just limited to the described embodiment, and various modifications are possible within the scope of the present invention. For example, even though the semiconductor device 10 provided in the liquid crystal module 20 has been described as having a single semiconductor chip 4, the invention is not limited to such an implementation. For example, as shown in FIG. 3, a semiconductor device 40 may be provided that includes a plurality of semiconductor chips 41 and 42 on the substrate 1. That is, two or more semiconductor chips 4 may be provided.

The plurality of semiconductor chips, such as the semiconductor chips 41 and 42, are not necessarily required to have the same function. For example, each semiconductor chip may have a distinct function, for example, for liquid crystal driving, a system operation, or memory use. Specifically, the semiconductor chip 41 may be used for a liquid crystal driver, and the semiconductor chip 42 for a liquid crystal controller.

Further, in addition to the semiconductor chips 41 and 42, the substrate 1 of the semiconductor device 40 may optionally include electrical components 43, which may be, for example, a resistor, a capacitor, or a LED (Light Emitting Diode).

Figure 4:
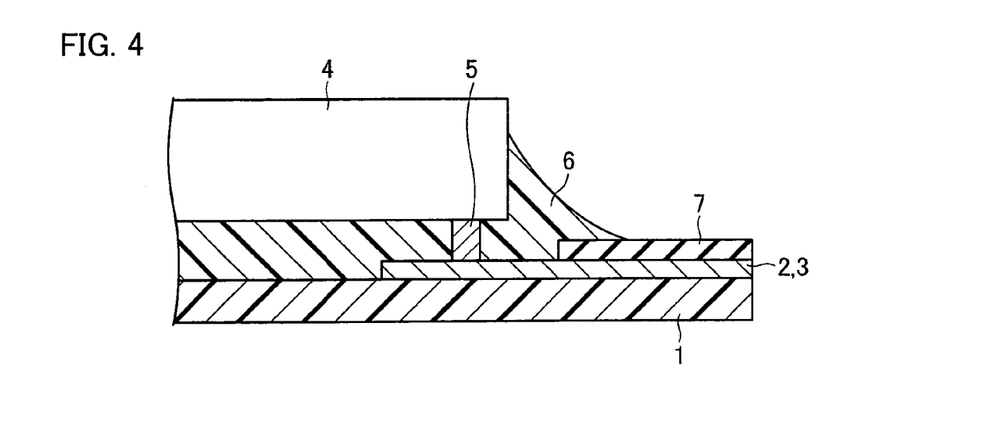
FIG. 4 is a cross sectional view illustrating a main portion of the semiconductor device.

Further, the foregoing described the case where the wiring patterns 2 and 3 are tin (Sn), or plated with tin (Sn). However, the present invention is not just limited to such an implementation. For example, the wiring patterns 2 and 3 may be gold (Au), or plated with gold (Au), as shown in FIG. 4.

With the wiring patterns 2 and 3 made of gold (Au) or plated with gold (Au), bonding with the bump electrodes 5 can be made with the same metal (Au). This improves transmission efficiency.

As described above, the semiconductor device 10 of the present embodiment is structured to include the semiconductor chip 4 mounted on the substrate 1 formed of an organic insulating film and including the wiring patterns 2 and 3. With the anisotropic conductive adhesive 11, the semiconductor device 10 is electrically connected to the liquid crystal display panel 12 and the PW board 30.

Further, in the present embodiment, the surface of the organic insulating film is treated with the silicon coupling material 31. This improves the adhesion between the anisotropic conductive adhesive 11 and the insulating film substrate 1 when the anisotropic conductive adhesive 11 is used to electrically connect the wiring patterns 2 and 3 of the semiconductor device 10 to the wirings of the liquid crystal display panel 21 and the PW board 30. There accordingly will be no electrical failure caused by detachment, and application of additional reinforcing materials will not be necessary. As a result, cost is reduced.

Thus, with the semiconductor device 10, the adhesion between the insulating film substrate 1 and the anisotropic conductive adhesive 11 can be improved, and no additional adhesion reinforcing member will be required.

In the semiconductor device 10 of the present embodiment, the insulating film is made of polyimide. By the surface treatment of the polyimide insulating film with the silicon coupling material, the adhesion can be improved even more effectively.

Further, in the semiconductor device 10 of the present embodiment, the silicon (Si) contained as the constituting element of the silicon coupling material 31 is in a range of 0.5 atomic percent to 12.0 atomic percent (surface element density) on the surface of the insulating film. This effectively improves adhesion between the insulating film substrate 1 and the anisotropic conductive adhesive 11.

In the semiconductor device 40 of the present embodiment, the semiconductor chip 4 mounted on the substrate 1 can have a distinct function. For example, the semiconductor chips 41 and 42 are provided that may be used for, for example, liquid crystal driving, a system operation, or memory.

Thus, the adhesion between the insulating film substrate 1 and the anisotropic conductive adhesive 11 can be improved irrespective of the functions of the semiconductor chips 41 and 42.

The semiconductor device 40 of the present embodiment may be adapted to include the semiconductor chips 41 and 42 mounted on the substrate 1.

Even with the semiconductor chips 41 and 42 mounted in the semiconductor device 40, the adhesion between the insulating film substrate 1 and the anisotropic conductive adhesive 11 can be improved.

Further, in the semiconductor devices 10 and 40 of the present embodiment, it is preferable that the bump electrodes 5 formed on the semiconductor chips 4, 41, and 42 be made of gold (Au), and that the wiring patterns 2 and 3 formed on the substrate 1 be made of tin (Sn) or plated with tin (Sn).

In this way, the bump electrodes 5 of the semiconductor chips 4, 41, and 42 can be bonded with the wiring patterns 2 and 3 of the substrate 1 by a gold (Au)-tin (Sn) alloy. This improves bonding strength.

Further, in the semiconductor devices 10 and 40 of the present embodiment, it is preferable that the bump electrodes 5 formed on the semiconductor chips 4, 41, and 42 be made of gold (Au), and that the wiring patterns 2 and 3 formed on the substrate 1 be also made of gold (Au), or plated with gold (Au).

In this way, the bump electrodes 5 of the semiconductor chips 4, 41, and 42 can be bonded with the wiring patterns 2 and 3 of the substrate 1 by a gold (Au)-gold (Au) bond. This improves bonding strength.

Further, in the semiconductor device 40 of the present embodiment, the substrate 1 may include electrical components 43, such as a resistor, a capacitor, and a LED, in addition to the semiconductor chips 41 and 42.

Even with the electrical components 43 such as a resistor, a capacitor, and a LED mounted in the semiconductor device 40 in addition to the semiconductor chips 41 and 42, the adhesion between the insulating film substrate 1 and the anisotropic conductive adhesive 11 can be improved.

In the liquid crystal module 20 of the present embodiment, the liquid crystal display panel 21 and the semiconductor device 10 are electrically connected to each other with the anisotropic conductive adhesive 11, and the surface of the organic insulating film of the semiconductor device 10 is treated with the silicon coupling material 31.

Thus, with the liquid crystal module 20, the adhesion between the insulating film substrate 1 and the anisotropic conductive adhesive 11 can be improved, and no additional adhesion reinforcing member will be required.

The liquid crystal module 20 of the present embodiment is fabricated according to the following procedure. First, the organic insulating film is subjected to a surface treatment using the silicon coupling material 31, and the wiring patterns 2 and 3 are formed on the organic insulating film substrate 1. The wiring patterns 2 and 3 are then connected to the semiconductor chip 4 to obtain the semiconductor device 10. Here, the silicon coupling material 31 contains silicon (Si) in a range of 0.5 atomic percent to 12.0 atomic percent (surface element density) on the surface of the insulating film. Note that, the organic insulating film may be subjected to a surface treatment with the silicon coupling material 31 after forming the semiconductor device 10.

Thereafter, the wiring patterns 2 and 3 of the semiconductor device 10 are electrically connected to the liquid crystal display panel 21 with the anisotropic conductive adhesive 11.

With the manufacturing method of the liquid crystal module 20 described so far, the adhesion between the insulating film substrate 1 and the anisotropic conductive adhesive 11 can be improved, and no additional adhesion reinforcing member will be required.

EXAMPLE 1

In order to confirm effects of the foregoing structure, evaluation experiments were conducted in the manner described below.

First, evaluation was made as to the adhesion strength between the insulating film surface-treated with the silicon coupling material 31, and the anisotropic conductive adhesive 11.

The silicon coupling material 31 contained SiX in a solvent. The surface of the insulating film had SiX in a range of 0.5 atomic percent to 12.0 atomic percent (surface element density).

Figure 5:
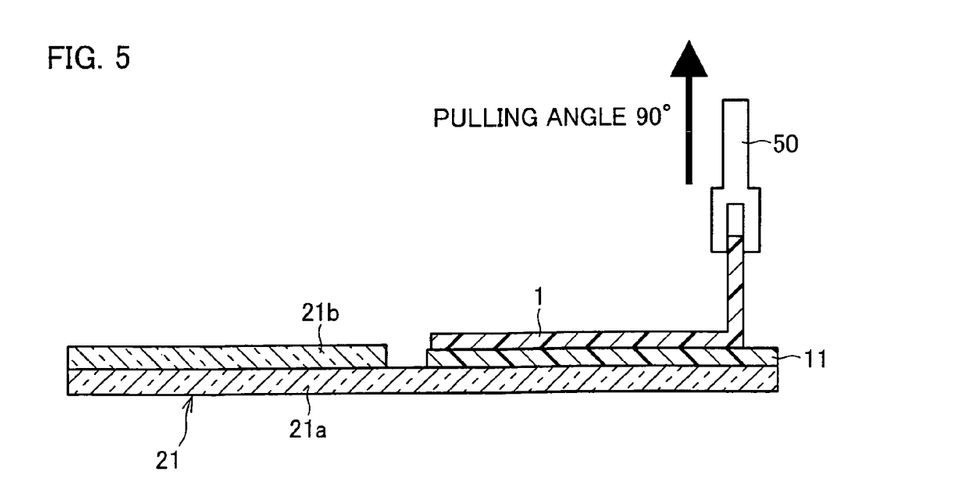
FIG. 5 is a cross sectional view illustrating how adhesion strength of an insulating film that has been surface-treated with the silicon coupling material is measured.

The adhesion strength was measured according to the following procedure. First, as shown in FIG. 5, the TFT substrate 21a of the liquid crystal display panel 21 was bonded to the insulating film forming the substrate 1, with the anisotropic conductive adhesive 11 in between. Then, the insulating film was pulled with a pulling jig at a pulling angle of 90°.

Figure 6:
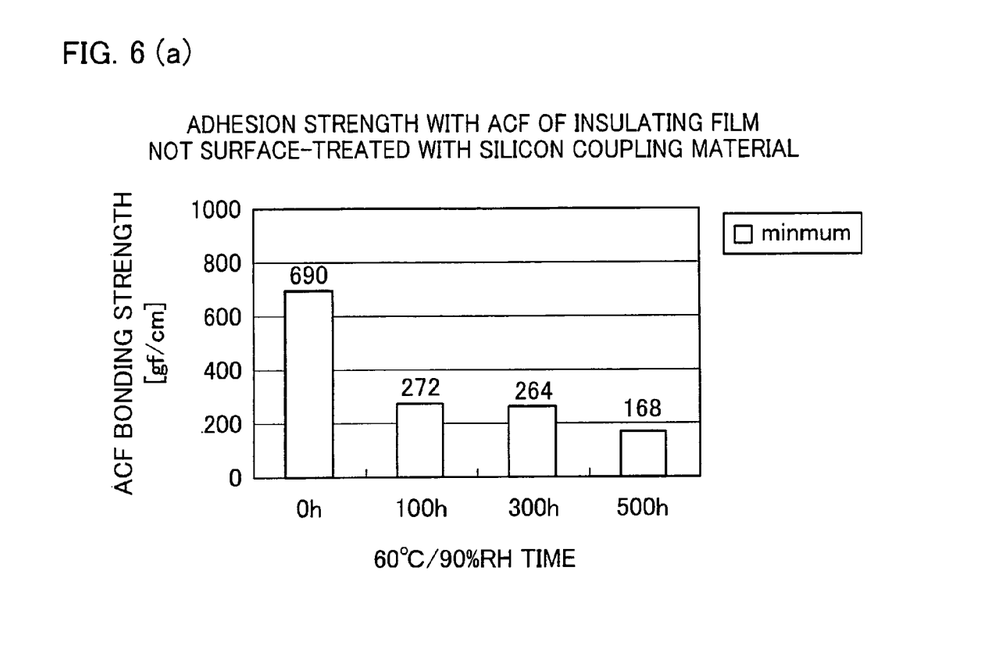
FIG. 6(a) is a graph representing results of measurement on adhesion strength of the insulating film that has been surface-treated with the silicon coupling material.
FIG. 6(b) is a graph representing results of measurement on adhesion strength of an insulating film that is not surface-treated with the silicon coupling material.

As a result, as shown in FIG. 6($b$), there was improvement of adhesion strength 0 hour, 100 hours, 300 hours, and 500 hours after the start of experiment at 60° C./90% RH, as compared with COF that was not treated with the silicon coupling material 31, shown in FIG. 6($a$). Overall, the adhesion increased about 88 percent (316/168=1.88). Note that, the values of adhesion strength of the anisotropic conductive adhesive 11 shown in FIGS. 6($a$) and 6($b$) are based on unit width of the insulating film. In each group of samples, the minimum value is shown.

Figure 7:
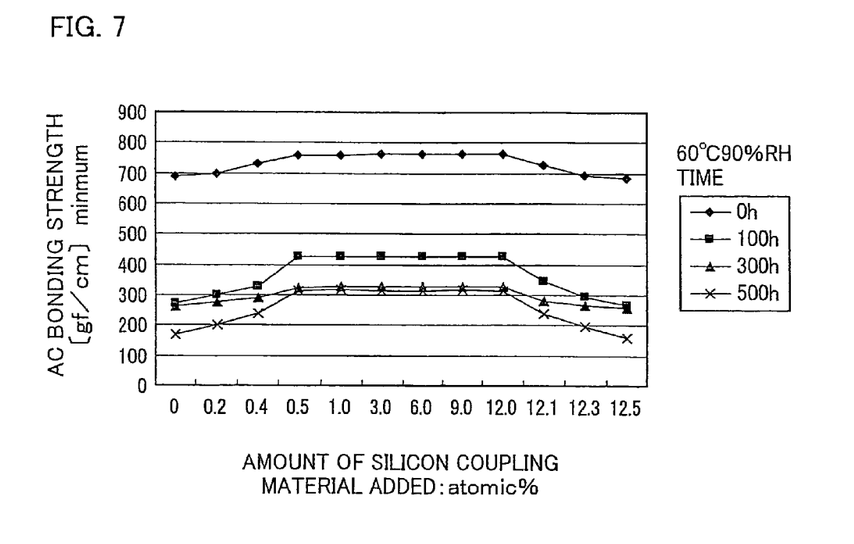
FIG. 7 is a graph representing results of measurement on adhesion strength measured at varying amounts of the silicon coupling material.

FIG. 7 represents results of measurement on adhesion strength measured at varying amounts of the silicon coupling material 31. There was no improvement in adhesion in samples in which the surface element density of the silicon coupling material on the surface of the insulating film was at or below 0.4 atomic percent, as with samples without surface-treatment. The bonding strength decreased when the surface element density of the silicon coupling material 31 was at or above 13 atomic percent.

EXAMPLE 2

Manufacture of the liquid crystal module 20 involves washing with a solvent. As such, solvent resistance to solvents was also examined by experiment.

As the solvents, isopropyl alcohol and acetone were used that are commonly used for washing. In the experiment, an insulating film surface-treated with the silicon coupling material 31 was immersed in isopropyl alcohol and acetone for one hour at ordinary temperature, and the film was observed by visual inspection. As in the foregoing experiment, the surface element density of the silicon coupling material 31 on the surface of the insulating film was 0.5 atomic percent to 12.0 atomic percent.

As summarized in Table 1 below, insulating films surface-treated with the silicon coupling material 31 had no detaching, swelling, dissolving, or cracking, as with insulating films with no surface treatment.

Further, in a semiconductor device of the present invention, the substrate may include a semiconductor chip of a distinct function. For example, a semiconductor chip for liquid crystal driving, a system operation, or memory can be mounted on the substrate.

In this way, the adhesion between the insulating film substrate and the anisotropic conductive adhesive can be improved irrespective of the function of the semiconductor chip.

TABLE 1

| SOLVENT | SAMPLE | COF W/O SURFACE TREATMENT | COF WITH SURFACE TREATMENT |
|---|---|---|---|
| ISOPROPYL ALCOHOL | 1 | NO DETACHING, SWELLING, DISSOLVING, OR CRACKING | NO DETACHING, SWELLING, DISSOLVING, OR CRACKING |
| | 2 | NO DETACHING, SWELLING, DISSOLVING, OR CRACKING | NO DETACHING, SWELLING, DISSOLVING, OR CRACKING |
| | 3 | NO DETACHING, SWELLING, DISSOLVING, OR CRACKING | NO DETACHING, SWELLING, DISSOLVING, OR CRACKING |
| | 4 | OR DETACHING, SWELLING, DISSOLVING, OR CRACKING | NO DETACHING, SWELLING, DISSOLVING, OR CRACKING |
| | 5 | NO DETACHING, SWELLING, DISSOLVING, OR CRACKING | NO DETACHING, SWELLING, DISSOLVING, OR CRACKING |
| | 6 | NO DETACHING, SWELLING, DISSOLVING, OR CRACKING | NO DETACHING, SWELLING, DISSOLVING, OR CRACKING |
| | 7 | NO DETACHING, SWELLING, DISSOLVING, OR CRACKING | NO DETACHING, SWELLING, DISSOLVING, OR CRACKING |
| | 8 | NO DETACHING, SWELLING, DISSOLVING, OR CRACKING | NO DETACHING, SWELLING, DISSOLVING, OR CRACKING |
| ACETONE | 1 | NO DETACHING, SWELLING, DISSOLVING, OR CRACKING | NO DETACHING, SWELLING, DISSOLVING, OR CRACKING |
| | 2 | NO DETACHING, SWELLING, DISSOLVING, OR CRACKING | NO DETACHING, SWELLING, DISSOLVING, OR CRACKING |
| | 3 | NO DETACHING, SWELLING, DISSOLVING, OR CRACKING | NO DETACHING, SWELLING, DISSOLVING, OR CRACKING |
| | 4 | NO DETACHING, SWELLING, DISSOLVING, OR CRACKING | NO DETACHING, SWELLING, DISSOLVING, OR CRACKING |
| | 5 | NO DETACHING, SWELLING, DISSOLVING, OR CRACKING | NO DETACHING, SWELLING, DISSOLVING, OR CRACKING |
| | 6 | NO DETACHING, SWELLING, DISSOLVING, OR CRACKING | NO DETACHING, SWELLING, DISSOLVING, OR CRACKING |
| | 7 | NO DETACHING, SWELLING, DISSOLVING, OR CRACKING | NO DETACHING, SWELLING, DISSOLVING, OR CRACKING |
| | 8 | NO DETACHING, SWELLING, DISSOLVING, OR CRACKING | NO DETACHING, SWELLING, DISSOLVING, OR CRACKING |

As described above, it is preferable in a semiconductor device of the present invention that the insulating film be made of polyimide.

Generally, a substrate used for semiconductor devices is formed of an insulating film made of polyimide, which a highly heat resistant material. However, polyimide does not provide good adhesion to the anisotropic conductive adhesive, for which epoxy resin is often used for example. Thus, by the surface treatment of the polyimide insulating film with the silicon coupling material, the adhesion can effectively be improved.

Further, in a semiconductor device of the present invention, the substrate may include a plurality of semiconductor chips.

In this way, the adhesion between the insulating film substrate and the anisotropic conductive adhesive can be improved even when a plurality of semiconductor chips are mounted.

It is preferable in a semiconductor device of the present invention that the bump electrodes formed on the semiconductor chip be made of gold (Au), and that the wiring patterns on the substrate be made of tin (Sn) or plated with tin (Sn).

In this way, the bonding strength between the bump electrodes of the semiconductor chip and the wiring patterns on the substrate can be improved by the alloyed bond of gold (Au) and tin (Sn).

Further, it is preferable in a semiconductor device of the present invention that the bump electrodes formed on the semiconductor chip be made of gold (Au), and that the wiring patterns on the substrate be made of gold (Au) or plated with gold (Au).

In this way, the transfer efficiency can be improved by the gold (Au)-gold (Au) bond formed between the bump electrodes of the semiconductor chip and the wiring patterns on the substrate.

Further, it is preferable in a semiconductor device of the present invention that the substrate includes an electrical component such as a resistor, a capacitor, and a LED, in addition to the semiconductor chip.

In this way, the adhesion between the insulating film substrate and the anisotropic conductive adhesive can be improved in the semiconductor device in which an electrical component such as a resistor, a capacitor, and a LED is mounted in addition to the semiconductor chip.

A display module of the present invention includes the semiconductor device, wherein the semiconductor device is electrically connected to a display panel with the anisotropic conductive adhesive.

In a display module of the present invention, the display panel and the semiconductor device are electrically connected to each other with the anisotropic conductive adhesive, and the organic insulating film of the semiconductor device is surface-treated with the silicon coupling material.

Thus, with the display module, the adhesion between the insulating film substrate and the anisotropic conductive adhesive can be improved, and no additional adhesion reinforcing member will be required.

It is preferable in a display module of the present invention that the display panel be a liquid crystal display panel.

In this way, a liquid crystal display module can be provided in which the liquid crystal display panel can be bonded to the semiconductor device with improved adhesion between the insulating film substrate and the anisotropic conductive adhesive, and in which no additional adhesion reinforcing member is required.

A manufacturing method of a semiconductor device of the present invention includes the steps of: surface-treating an organic insulating film with the silicon coupling material so that the silicon (Si) contained as the constituting element of the silicon coupling material is in a range of 0.5 atomic percent to 12.0 atomic percent (surface element density) on the surface of the insulating film; and forming wiring patterns on the substrate formed of the organic insulating film and mounting a semiconductor chip. Note that, the surface treatment of the insulating substrate may be performed on either one of, or both of, the upper and lower surfaces of the insulating film. Further, the surface treatment of the organic insulating film with the silicon coupling material may be performed after forming the semiconductor chip on the substrate.

According to the manufacturing method of the present invention, a semiconductor device is manufactured by surface-treating an organic insulating film with the silicon coupling material, and then forming wiring patterns on a substrate formed of the organic insulating film and mounting a semiconductor chip. The silicon coupling material contains silicon (Si) in a range of 0.5 atomic percent to 12.0 atomic percent on the surface of the insulating film.

Thus, with the manufacturing method of a semiconductor device, the adhesion between the insulating film substrate and the anisotropic conductive adhesive can be improved, and no additional adhesion reinforcing member will be required.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device in which wiring patterns are formed on a substrate that is formed of an organic insulating film, and in which at least one semiconductor chip is mounted on, the semiconductor device comprising:
at least one surface of the insulating film is applied with a silicon coupling material, and the silicon coupling material having a SiX structure selected from the group consisting of $SiO_n$, $Si(OH)_n$ and $SiO_n(OH)_n$, and the silicon coupling material contains silicon (Si) at a surface element density of 0.5 atomic percent to 12.0 atomic percent on the applied surface of the insulating film, wherein n is a variable.

2. The semiconductor device as set forth in claim 1, wherein the insulating film comprises polyimide.

3. The semiconductor device as set forth in claim 1, wherein the at least one semiconductor chip mounted on the substrate has a distinct function.

4. The semiconductor device as set forth in claim 2, wherein the at least one semiconductor chip mounted on the substrate has a distinct function.

5. The semiconductor device as set forth in claim 3, wherein more than one semiconductor chip is mounted on the substrate.

6. The semiconductor device as set forth in claim 4, wherein more than one semiconductor chip is mounted on the substrate.

7. The semiconductor device as set forth in claim 1, wherein the at least one semiconductor chip has a bump electrode made of gold (Au), and wherein the wiring patterns formed on the substrate are made of tin (Sn) or plated with tin (Sn).

8. The semiconductor device as set forth in claim 2, wherein the wiring patterns formed on the substrate are made of tin (Sn) or plated with tin (Sn).

9. The semiconductor device as set forth in claim 1, wherein the at least one semiconductor chip has a bump electrode made of gold (Au), and wherein the wiring patterns formed on the substrate are made of gold (Au) or plated with gold (Au).

10. The semiconductor device as set forth in claim 2, wherein the at least one semiconductor chip has a bump electrode made of gold (Au), and wherein the wiring patterns formed on the substrate are made of gold (Au) or plated with gold (Au).

11. The semiconductor device as set forth in claim 1, wherein an electrical component is mounted on the substrate in addition to the at least one semiconductor chip.

12. The semiconductor device as set forth in claim 2, wherein an electrical component is mounted on the substrate in addition to the at least one semiconductor chip.

13. A display module using a semiconductor device in which wiring patterns are formed on a substrate that is formed of an organic insulating film, and in which at least one semiconductor chip is mounted on, the display module comprising:

at least one surface of the insulating film in the semiconductor device is applied with a silicon coupling material having a SiX structure selected from the group consisting of SiOn, Si(OH)n and SiOn(OH)n, and the silicon coupling material contains silicon (Si) at a surface element density of 0.5 atomic percent to 12.0 atomic percent on the applied surface of the insulating film, wherein n is a variable, the semiconductor device being electrically connected to a display panel with an anisotropic conductive adhesive.

14. The display module as set forth in claim 13, wherein the insulating film of the semiconductor device comprises polyimide.

15. The display module as set forth in claim 13, wherein the at least one semiconductor chip mounted on the substrate of the semiconductor device has a distinct function.

16. The display module as set forth in claim 14, wherein the at least one semiconductor chip mounted on the substrate of the semiconductor device has a distinct function.

17. The display module as set forth in claim 13, wherein more than one semiconductor chip is mounted on the substrate of the semiconductor device.

18. The display module as set forth in claim 14, wherein more than one semiconductor chip is mounted on the substrate of the semiconductor device.

19. The display module as set forth in claim 13, wherein the at least one semiconductor chip of the semiconductor device has a bump electrode made of gold (Au), and wherein the wiring patterns formed on the substrate are made of tin (Sn) or plated with tin (Sn).

20. The display module as set forth in claim 14, wherein the at least one semiconductor chip of the semiconductor device has a bump electrode made of gold (Au), and wherein the wiring patterns formed on the substrate are made of tin (Sn) or plated with tin (Sn).

21. The display module as set forth in claim 13, wherein the at least one semiconductor chip of the semiconductor device has a bump electrode made of gold (Au), and wherein the wiring patterns formed on the substrate are made of gold (Au) or plated with gold (Au).

22. The display module as set forth in claim 14, wherein the at least one semiconductor chip of the semiconductor device has a bump electrode made of gold (Au), and wherein the wiring patterns formed on the substrate are made of gold (Au) or plated with gold (Au).

23. The display module as set forth in claim 13, wherein an electrical component is mounted on the substrate of the semiconductor device in addition to the at least one semiconductor chip.

24. The display module as set forth in claim 14, wherein an electrical component is mounted on the substrate of the semiconductor device in addition to the at least one semiconductor chip.

25. The display module as set forth in claim 13, wherein the display panel comprises a liquid crystal display panel.

26. The display module as set forth in claim 14, wherein the display panel comprises a liquid crystal display panel.

27. The display module as set forth in claim 15, wherein the display panel comprises a liquid crystal display panel.

28. The display module as set forth in claim 16, wherein the display panel comprises a liquid crystal display panel.

29. The display module as set forth in claim 17, wherein the display panel comprises a liquid crystal display panel.

30. The display module as set forth in claim 18, wherein the display panel comprises a liquid crystal display panel.

31. The display module as set forth in claim 19, wherein the display panel comprises a liquid crystal display panel.

32. The display module as set forth in claim 20, wherein the display panel comprises a liquid crystal display panel.

33. The display module as set forth in claim 21, wherein the display panel comprises a liquid crystal display panel.

34. The display module as set forth in claim 22, wherein the display panel comprises a liquid crystal display panel.

35. The display module as set forth in claim 23, wherein the display panel comprises a liquid crystal display panel.

36. The display module as set forth in claim 24, wherein the display panel comprises a liquid crystal display panel.

* * * * *